(12) United States Patent
Li et al.

(10) Patent No.: US 6,972,438 B2
(45) Date of Patent: Dec. 6, 2005

(54) LIGHT EMITTING DIODE WITH POROUS SiC SUBSTRATE AND METHOD FOR FABRICATING

(75) Inventors: Ting Li, Ventura, CA (US); James Ibbetson, Santa Barbara, CA (US); Bernd Keller, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 10/676,953

(22) Filed: Sep. 30, 2003

(65) Prior Publication Data

US 2005/0184307 A1    Aug. 25, 2005

(51) Int. Cl.$^7$ ............................................. H01L 33/00
(52) U.S. Cl. ........................ 257/98; 257/99; 257/100; 257/103
(58) Field of Search .................... 257/98–100, 103, 257/95, 91

(56) References Cited

U.S. PATENT DOCUMENTS

| | | | |
|---|---|---|---|
| 4,946,547 A | 8/1990 | Palmour et al. | 156/643 |
| 5,200,022 A | 4/1993 | Kong et al. | 156/612 |
| 5,376,241 A | 12/1994 | Shor et al. | 204/129.3 |
| RE34,861 E | 2/1995 | Davis et al. | 437/100 |
| 5,644,156 A | 7/1997 | Suzuki et al. | 257/485 |
| 5,939,732 A * | 8/1999 | Kurtz et al. | 257/77 |
| 6,225,647 B1 * | 5/2001 | Kurtz et al. | 257/94 |
| 2001/0010449 A1 | 8/2001 | Chien-Chia et al. | |

FOREIGN PATENT DOCUMENTS

JP    07007179 A    1/1995

OTHER PUBLICATIONS

Applied Physics Letters, vol. 79, No. 15, Oct. 8, 2001, p. 2315-2317 "Impact of Texture-Enhanced Transmission On High-Efficiency Surface-Textured Light-Emitting Diodes", Windisch et al.

Applied Physics Letters, vol. 63, No. 16, Oct. 18, 1993, p. 2174-2176, "30% External Quantum Efficiency From Surface Textured, Thin-Film Light-Emitting Diodes", Schnitzer et al.

IEEE Journal on Selected Topics in Quantum Electronics, vol. 8, No. 2, Mar./Apr. 2002, p. 248-255, "Light-Extraction Mechanisms in High-Efficiency Surface-Textured Light-Emitting Diodes" Windische et al.

(Continued)

Primary Examiner—Minh-Loan Tran
(74) Attorney, Agent, or Firm—Koppel, Jacobs, Patrick & Heybl

(57) ABSTRACT

A method and apparatus for forming a porous layer on the surface of a semiconductor material wherein an electrolyte is provided and is placed in contact with one or more surfaces of a layer of semiconductor material. The electrolyte is heated and a bias is introduced across said electrolyte and the semiconductor material causing a current to flow between the electrolyte and the semiconductor material. The current forms a porous layer on the one or more surfaces of the semiconductor material in contact with the electrolyte. The semiconductor material with its porous layer can serve as a substrate for a light emitter. A semiconductor emission region can be formed on the substrate. The emission region is capable of emitting light omnidirectionally in response to a bias, with the porous layer enhancing extraction of the emitting region light passing through the substrate.

14 Claims, 4 Drawing Sheets

OTHER PUBLICATIONS

IEEE Journal on Selected Topics in Quantum Electronics, vol. 8, No. 2, Mar./Apr. 2002, p. 321-332, "High Brightness AlGaInP Light-Emitting Diodes", Streubel et al.

IEEE Transactions on Electron Devices, vol. 47, No. 7, Jul./2000, p. 1492-1498 "40% Efficient Thin-Film Surface-Textured Light-Emitting Diodes by Optimization of Natural Lithography", Windisch et al.

SPIE vol. 393B (2000), Light-Emitting Diodes, Manufacturing and Applications IV, Invited Paper, "Non-Resonant Cavity Light-Emitting Diodes", Windisch et al., p. 70-76.

Shor, et al. "Direct Observation of Porous Sic Formed by Anodization in HV", Applied Physics Lett. 62, May 31, 1993, p. 2836-2838.

Mimura et al., "Blue Electrolumineschnch From Porous Silicon Carbide", Applied Physics lett. 65, Dec. 26, 1994, pp. 3350-3352.

Zangooie et al., "Surface, Pore Morphology and Optical Properties of Porous", Journal of The Electrochemical Society, 148(6) G297-G302 (2001).

Lagoubi, A. et al. "Conditioning of N-Silicon by Photoelectrochemical Etching for Photovaltaic Applications" Proc. of the 11$^{th}$ E.C. Photovoltaic Solar Energy Conference, Oct. 12, 1992-Oct. 16, 1992, pp. 250-253, XP008043956 pp. 252-253 Figure 8.

Patent Abstracts of Japan, 07007179, Oct. 1, 1995, Sanyo Electric CO LTD, "Light Emitting Elements".

* cited by examiner

LIGHT EMITTING DIODE WITH POROUS SIC SUBSTRATE AND METHOD FOR FABRICATING

This invention was made with Government support under the Department of Energy (NETL) Contract No. DE-FC 26-00NT40985. The Government has certain rights in this invention

BACKGROUND OF THE INVENTION

1. Field of the Invention

This invention relates to semiconductor based light emitters, and more particularly to light emitting diodes comprising an emission region formed on a substrate.

2. Description of the Related Art

Light emitting diodes (LEDs) are an important class of solid state devices that convert electric energy to light and generally comprise an active layer of semiconductor material sandwiched between two oppositely doped layers. When a bias is applied across the doped layers, holes and electrons are injected into the active layer where they recombine to generate light. Light is emitted omnidirectionally from the active layer and from all surfaces of the LED.

There has been a great deal of recent interest in LEDs formed of Group-III nitride based material systems because of their unique combination of material characteristics including high breakdown fields, wide bandgaps (3.36 eV for GaN at room temperature), large conduction band offset, and high saturated electron drift velocity. The doped and active layers are typically formed on a substrate that can be made of different materials such as silicon (Si), silicon carbide (SiC), and sapphire ($Al_2O_3$). SiC wafers are often preferred because they have a much closer crystal lattice match to Group-III nitrides, which results in Group III nitride films of higher quality. SiC also has a very high thermal conductivity so that the total output power of Group III nitride devices on SiC is not limited by the thermal resistance of the wafer (as is the case with some devices formed on sapphire or Si). Also, the availability of semi insulating SiC wafers provides the capacity for device isolation and reduced parasitic capacitance that make commercial devices possible. SiC substrates are available from Cree Inc., of Durham, N.C. and methods for producing them are set forth in the scientific literature as well as in U.S. Pat. Nos. Re. 34,861; 4,946,547; and 5,200,022.

The efficient extraction of light from LEDs is a major concern in the fabrication of high efficiency LEDs. For conventional LEDs with a single out-coupling surface, the external quantum efficiency is limited by total internal reflection (TIR) of light from the LED's emission region that passes through the substrate. TIR can be caused by the large difference in the refractive index between the LED's semiconductor and surrounding ambient LEDs with SiC substrates have relatively low light extraction efficiencies because the high index of refraction of SiC (approximately 2.7) compared to the index of refraction for the surrounding material, such as epoxy (approximately 1.5). This difference results in a small escape cone from which light rays from the active area can transmit from the SiC substrate into the epoxy and ultimately escape from the LED package.

Different approaches have been developed to reduce TIR and improve overall light extraction, with one of the more popular being surface texturing. Surface texturing increases the light's escape probability by providing a varying surface that allows photons multiple opportunities to find an escape cone. Light that does not find an escape cone continues to experience TIR, and reflects off the textured surface at different angles until it finds an escape cone. The benefits of surface texturing have been discussed in several articles. [See Windisch et al., *Impact of Texture-Enhanced Transmission on High-Efficiency Surface Textured Light Emitting Diodes*, Appl. Phys. Lett., Vol. 79, No. 15, October 2001, Pgs. 2316–2317; Schnitzer et al. *30% External Quantum Efficiency From Surface Textured, Thin Film Light Emitting Diodes*, Appl. Phys. Lett., Vol 64, No. 16, October 1993, Pgs. 2174–2176; Windisch et al. *Light Extraction Mechanisms in High-Efficiency Surface Textured Light Emitting Diodes*, IEEE Journal on Selected Topics in Quantum Electronics, Vol. 8, No. 2, March/April 2002, Pgs. 248–255; Streubel et al. *High Brightness AlGaNInP Light Emitting Diodes,* IEEE Journal on Selected Topics in Quantum Electronics, Vol. 8, No. March/April 2002].

It has proven difficult to create a useful roughened surface on SiC and it is believed that these difficulties are caused by the chemically inert nature of SiC. Accordingly, a LED formed of an emission region on a SiC substrate can not include useful roughened surfaces on the SiC substrate to enhance light extraction. The backside surfaces of SiC substrates have been lapped to in an attempt to provide a useful level of roughness, but these attempts have met with limited success and did not result in a LED with significantly enhanced light extraction.

Porous SiC has been fabricated on n-type 6H—SiC by anodizing the material in HF under UV illumination. [Shor et al. *Direct Observation of Porous SiC Formed by Anodization in HF*, Appl. Phys. Lett., Vol. 62, No. 22, May 1993, Pgs. 2636–2638]. A blue emitting LED has also been demonstrated having porous SiC as its luminescent layer. [Mimura et al. *Blue Electroluminescence From Porous Silicon Carbide*, Appl. Phys. Lett., Vol. 65, No. 26, Dec. 1994, Pgs. 3350–3352]. The microstructural and optical properties of porous SiC have also been investigated using electron microscopy and sprectroscopy ellipsometry. [Zangooie et al. *Surface, Pore Morphology, and Optical Properties of 4H—SiC*, Journal of Electrochemical Society, Vol. 148, No. 6, Pgs. G297–G302].

SUMMARY OF THE INVENTION

The present invention seeks to provide a method and apparatus for forming a porous layer on the surface of a semiconductor material, with the semiconductor material then being used as a substrate for an LED. The porous layer is arranged to improve extraction of the LED light that passes through the substrate.

An apparatus for forming a porous layer on the surface of a semiconductor according to the present invention comprises an HF based electrolyte held in a reservoir. The reservoir is arranged to allow the electrolyte to contact one or more surfaces of a layer of semiconductor material. The apparatus further comprises a heater for heating the electrolyte, and a power source for applying a bias across the electrolyte and the layer of semiconductor material. The bias causes a current to run between the electrolyte and the layer of semiconductor material forming a porous layer on the one or more surfaces in contact with said electrolyte.

A method for forming a porous layer on the surface of a semiconductor according to the present invention comprises providing an electrolyte and placing the electrolyte in contact with one or more surfaces of a layer of semiconductor material. The electrolyte is heated and a bias is introduced across the electrolyte and the semiconductor material causing a current to flow between the electrolyte and the semiconductor material, forming a porous layer on the one or more surfaces of the semiconductor material in contact with the electrolyte.

A light emitter according to the present invention comprises a substrate having a porous layer and a semiconductor emission region formed on the substrate. The emission region is capable of emitting light omnidirectionally in response to a bias, with the porous layer enhancing extraction of the emission region light passing through the substrate.

A light emitting diode (LED) package according to the present invention comprises an LED having a substrate with a porous layer on one or more surfaces and an emission region formed on a surface of the substrate not having a porous layer. The package further comprises a metal layer with the LED flip-chip mounted to the metal layer such that the substrate becomes the primary emission surface of said LED. At least two contacts are included for applying a bias across the emission region, causing the emission region to emit light omnidirectionally. The porous layer enhances light extraction of emission region light passing through the substrate.

These and other further features and advantages of the invention would be apparent to those skilled in the art from the following detailed description, taking together with the accompanying drawings, in which:

DETAILED DESCRIPTION OF THE INVENTION

Aparatus and Method for Forming Porous Layer

Figure 1:
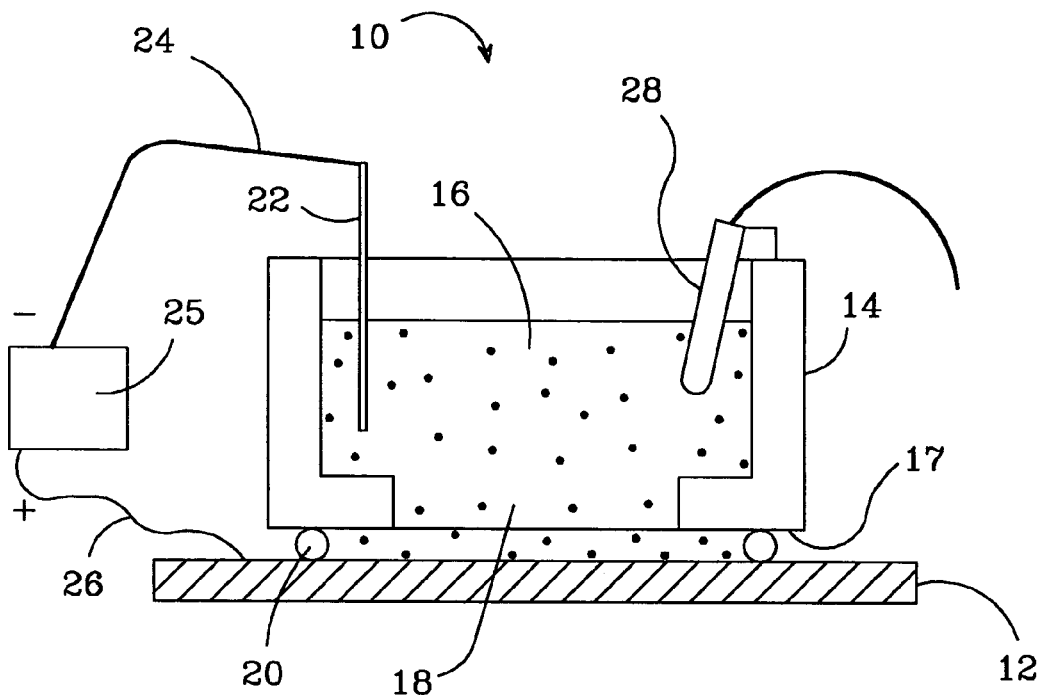
FIG. 1 is a sectional view of an embodiment of apparatus according to the present invention for forming a porous layer on the surface of a semiconductor.

FIG. 1 shows one embodiment on an apparatus 10 according to the present invention for forming a porous layer on the surface of a semiconductor material 12, with the apparatus 10 preferably used to form a porous layer on the surface of silicon carbide (SiC). The apparatus 10 includes a cup shaped reservoir/housing 14 holding a liquid HF-based electrolyte 16 that can comprise different solutions in different concentrations. A suitable solution for the electrolyte 16 comprises ethanol ($C_2H_5OH$) and water, with ethanol in a concentration range of a 10 to 50%. Another suitable solution comprises a buffered HF-based electrolyte that provides for a more constant Ph value over time and provides for a solution that is less volatile and less dangerous to work with. A preferred buffered HF-based electrolyte comprises ammonium fluoride ($NH_4F$) and water, with the $NH_4F$ having different concentrations such as 20% per volume.

The semiconductor 12 is arranged adjacent to the bottom surface 17 of the reservoir 14 and the bottom of the reservoir 14 has an opening/hole 18 to allow the HF-based solution to pass out the reservoir 14. A watertight seal is provided between the semiconductor 12 and the reservoir's bottom surface 17 around the opening 18 and near the bottom surface's outside edge. The seal is preferably provided by an O-ring 20, although other sealing components can be used such as gaskets or sealants such as silicone.

As the reservoir 14 is filled with the HF-based electrolyte 16, some of the electrolyte passes through the hole 18 and fills the space between the housing 14 and the semiconductor 12. The O-ring 20 retains the electrolyte 16 in contact with the top surface of the semiconductor 12 and prevents the electrolyte 16 from leaking past the O-ring 20.

The apparatus 10 also comprises a cathode 22 that is immersed within the electrolyte 16 from the top of the housing 12. The cathode 22 can be made of many different materials that conduct a charge to the electrolyte 16 while at the same time not reacting with or dissolving in the electrolyte 16. A preferred material for the cathode 22 is platinum (Pt).

A first conductor 24 is coupled between the negative terminal of a power source 25 and the cathode 22 so that an electrical signal at the negative terminal passes to the cathode 22. A second conductor 26 is coupled between the positive terminal of the power source 25 and the semiconductor 12 so that an electrical signal at the positive terminal passes into the semiconductor 12. The power source 25 provides a bias at its positive and negative terminal that is conducted to the cathode 22 and semiconductor material 12. The bias then causes a current to run between the cathode 22 and the semiconductor material 12. The reservoir opening 18 should be large enough to allow current to flow between the cathode 22 and the semiconductor 12, with the current passing into the semiconductor 12 across most of its surface that is contact with the electrolyte 16.

The second conductor 26 should be coupled to the semiconductor 12 in a location that is not in contact with the electrolyte 16 to be sure that the current runs through the semiconductor and not only between the cathode 22 and the second conductor 26. Many different power sources can be used in the apparatus 10, with a preferred power source being a precision current-voltage source meter having a computer controlled interface that can provide a pre-set constant current or constant voltage. Commercially available power sources can be used such as the Keithley 2400 Source Meter, provided by Keithley Instruments Inc.

The power source 25 can be set to many different current limits, but the porous layer formation process can be difficult to control if the current limit is set too high, and the process being time consuming if the current limit is set too low. A suitable range for the current limits is 0.1 to 100 milli-amps/$cm^2$. The power source can also be set to many different voltages, with a suitable voltage being 2–3 volts. A voltage upper limit can be set to 5 volts to allow for better control of the pore formation process. The power source 25 preferably provides a constant current drive density, such as in the range of 0.1 to 100 MA/$cm^2$, and allows the voltage to vary to meet that current, with the voltage remaining below the set upper limit.

Heating of the electrolyte 16 during formation of the porous layer results in a semiconductor surface having superior light extraction characteristics when used as the substrate of an LED, compared to an LED having a substrate with a porous layer formed without electrolyte heating. Many different heating mechanisms can be used to heat the electrolyte, such as a commercially available immersion heater 28 or a commercially available hot-plate. The electrolyte can be heated to different temperatures during the porous layer formation process, with a suitable temperature range being 40 to 90° C.

In another embodiment of an apparatus for forming a porous layer on the surface of a semiconductor according to the present invention, the electrolyte 16 can be illuminated by UV light during the pore formation process, with a suitable UV light source (lamp) providing broadband UV illumination. The lamp can be arranged above the electrolyte and directed down to provide the illumination. Alternatively, a steering mirror can be arranged above the electrolyte to redirect the lamp light down on the electrolyte 16.

Figure 2:
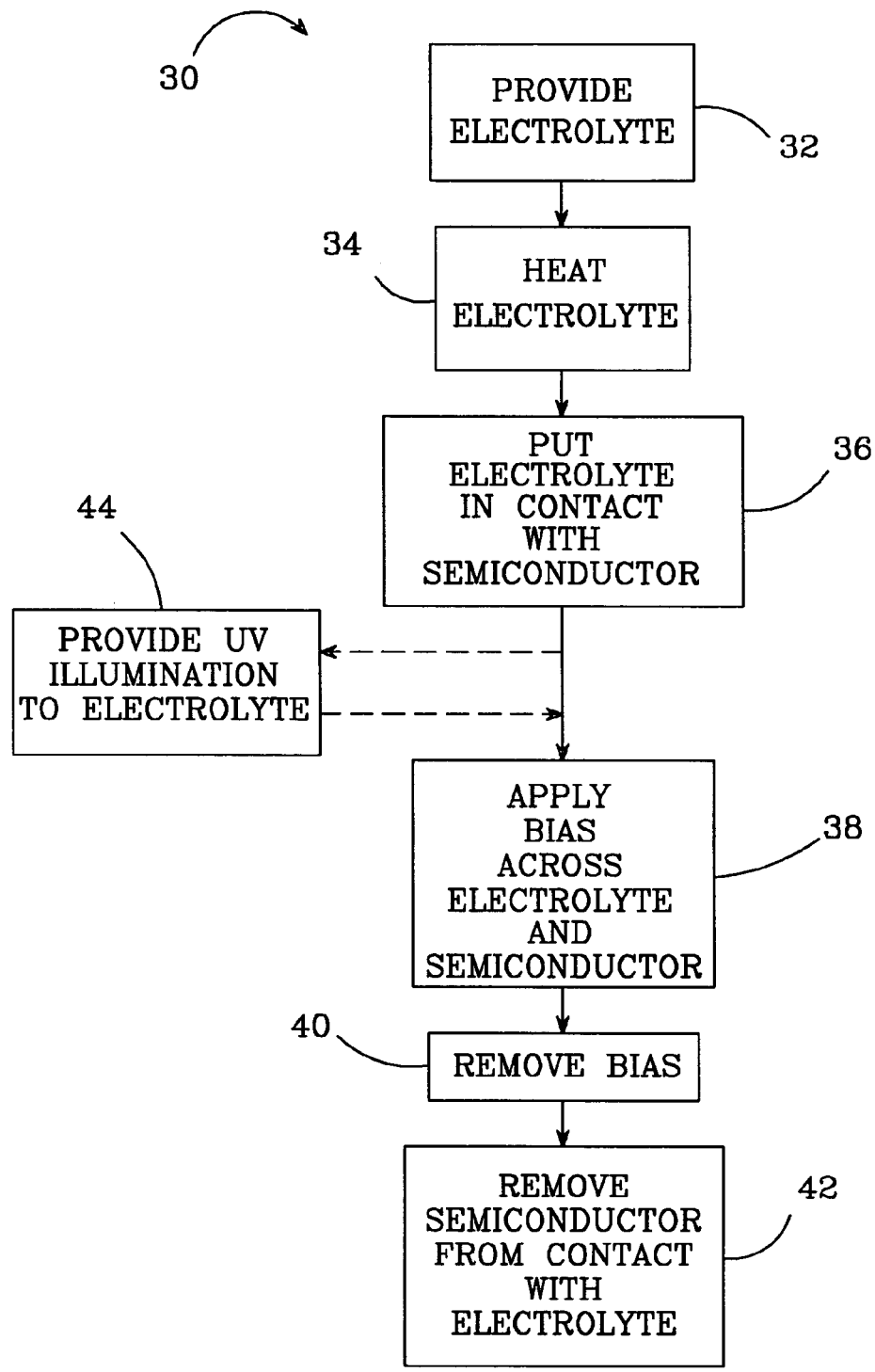
FIG. 2 is a flow diagram for an embodiment of a method according to the present invention for forming a porous layer on the surface of a semiconductor.

FIG. 2 shows a flow diagram for one embodiment of a method 30 according to the present invention for forming a porous layer on the surface of a semiconductor material. The method 30 can utilize apparatus 10 in the formation process, although other pore formation apparatus can be used. In step 32 a HF based electrolyte is provided that can be a HF based electrolyte or buffered HF based electrolyte described above as electrolyte 16. In step 34, the electrolyte is heated, with suitable methods for heating being an immersion heater or a hot plate. In step 36, the electrolyte is placed in contact with the semiconductor material, such as by providing the electrolyte in a reservoir that has a hole for the electrolyte to pass through and contact the semiconductor. A sealant or other retaining means is provided to hold the electrolyte in contact with the semiconductor while not allowing all of the electrolyte to pass out of the reservoir. As described above, the semiconductor can be placed adjacent to the reservoir hole and an O-ring can be included between the reservoir and semiconductor, around the hole.

In step 38, a bias is applied across the electrolyte and the semiconductor, which causes a current to flow between the electrolyte and the semiconductor. The current forms a porous layer on the surface(s) of the semiconductor in contact with the electrolyte and the bias is applied until the pores reach the desired depth in the semiconductor. The volume of semiconductor material that becomes porous is proportional to the time integrated current applied through the electrolyte; i.e. the total volume of semiconductor material having pores is proportional to the total charge applied to the material through the electrolyte. Using a current density of 0.1 to 100 mA/cm$^2$ through the electrolyte, a typical time for applying the bias is in the range of 500–1,500 seconds, although the bias could be applied for more or less time. This typically forms a porous layer that is approximately three (3) microns deep.

In step 40, the bias is removed from the electrolyte and the semiconductor at the end of the formation time and in step 42, the semiconductor is removed from contact with the electrolyte. After the method 40 is complete, the semiconductor can be used further processed as part of an LED. The semiconductor can serve as a substrate, with an LED emission region formed on the surface of the semiconductor opposite the porous layer. In one embodiment of a method according to the present invention, the porous layer is formed in SiC which can then be used as the substrate for an LED.

The method 30 can also include the optional step 44 that provides for UV illumination electrolyte during formation of the porous layer.

Light Emitting Diodes

Figure 3:
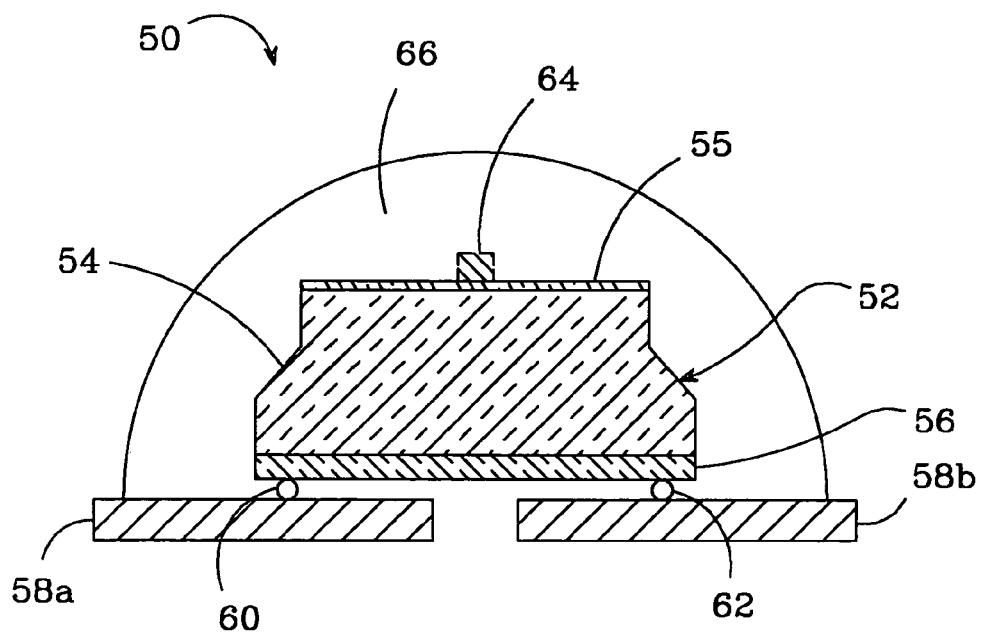
FIG. 3 is a sectional view of one embodiment of an LED according to the present invention having a substrate with a porous layer.

FIG. 3 shows one embodiment of an LED package 50 according to the present invention, which includes an LED 52 comprising a substrate 54 having a porous layer 55 to improve light extraction of LED light passing through the substrate 54. The substrate 54 can be made of many materials and can be many different thicknesses, with a suitable material being SiC with a thickness range of 125–500 microns. The LED 52 comprises a standard emission region 56 formed on the substrate 54 using known processes such as metal-organic chemical vapor deposition (MOCVD). The operational details of conventional LEDs are known and are only briefly discussed. The LED's emission region 56 can include an active layer sandwiched between two oppositely doped layers, with the layers having standard thicknesses and the active layer emitting light omnidirectionally when a bias is applied across the oppositely doped layers. The layers of the emission region can be made of many different semiconductor material systems such as the Group-III Nitride based material system. The LED 52 is arranged in the package 50 in a flip-chip orientation with the substrate 54 being the LED's primary emission surface.

The LED 52 is flip-chip mounted on first and second metal layer 58a, 58b. A first contact 60 is coupled between the first metal layer 58a and one of the oppositely doped layers in the emission region 56 and a second contact 62 is coupled between the second metal layer 58b and the emission region's other doped layer. A bias can be applied to the contacts 60, 62 through the first and second metal layers 58a, 58b, and the bias is then conducted through the contact 60, 62 to the oppositely doped layers in the emission region, causing the active layer to emit light.

In other LED embodiments having a substrate that is conductive enough to transmit a charge, a substrate contact 64 can be used to apply a bias to one of the oppositely doped layers. The other doped layer is contacted to one of the contacts 60, 62 arranged between the metal layers 58a, 58b and the LED. A bias is applied to the LED through contact 64 and one of the metal layers 58a, 58b, and the bias can be conducted to the substrate contact 64 from the other of the metal layers 58a, 58b, through a conductive wire (not shown) that runs from the metal layer 58 to the contact 64.

The top surface of the metal layers 58a, 58b can also be reflective so that light emitted from the emission region toward the metal layers 58a, 58b is reflected back to contribute to the overall emission of the LED package 50. The LED 52 and its contacts can be encased in a clear protective material 66, which is typically a transparent epoxy covering the LED 52 and the top surface of the metal layers 58a, 58b.

Alternatively, the LED 52 can be mounted on the horizontal base of a "metal cup" that typically has conductive paths (not shown) for applying a bias across the contacts on the emission regions oppositely doped layers. The top surface of the metal cup can also be reflective to reflect light from the emission region such that the light contributes to the light emission of the LED package.

The substrate 54 comprises a porous layer 55 that, in the flip-chip arrangement of the LED 52 is the top and primary emission surface of the LED 52. The porous layer 55 is arranged to enhance the light emission of the LED 52. The efficiency of conventional LEDs is limited by their inability to emit all of the light that is generated by the active layer.

When the flip-chip arranged LED is emitting, light reaches the primary emitting substrate surface at many different angles. Typical substrate semiconductor materials have a high index of refraction compared to ambient air or encapsulating epoxy. Light traveling from a region having a high index of refraction to a region with a low index of refraction that is within a certain critical angle (relative to the surface normal direction) will cross to the lower index region. Light that reaches the surface beyond the critical angle will not cross but will experience total internal reflection (TIR). In the case of an LED, the TIR light can continue to be reflected within the LED until it is absorbed. Because of this phenomenon, much of the light generated by conventional LEDs does not emit, degrading its efficiency.

The porous layer 55 improves light extraction of the LED 52 by providing a varying surface that allows light that would otherwise be trapped in the LED 52, by total internal reflection (TIR), to escape from the substrate to contribute to light emission. The variations in the porous layer increases the chances that the TIR light will reach the substrate surface within the critical angle and will be emitted. For light that does not escape the substrate through the porous layer, the variations of the porous layer reflect the light at different angles, increasing the chances that the light will escape on the next pass.

The ability of the porous layer to enhance light extraction will initially increase as its depth increases. However, a point is reached where increases in the depth does not improve light extraction, but may actually reduce it. For substrate 54 made of SiC and having a porous layer formed using method 30 described above in FIG. 2, a suitable porous layer depth is approximately three (3) microns. Different porous layer formation processes using different electrolytes can result in different suitable porous layer depths.

Figure 4:
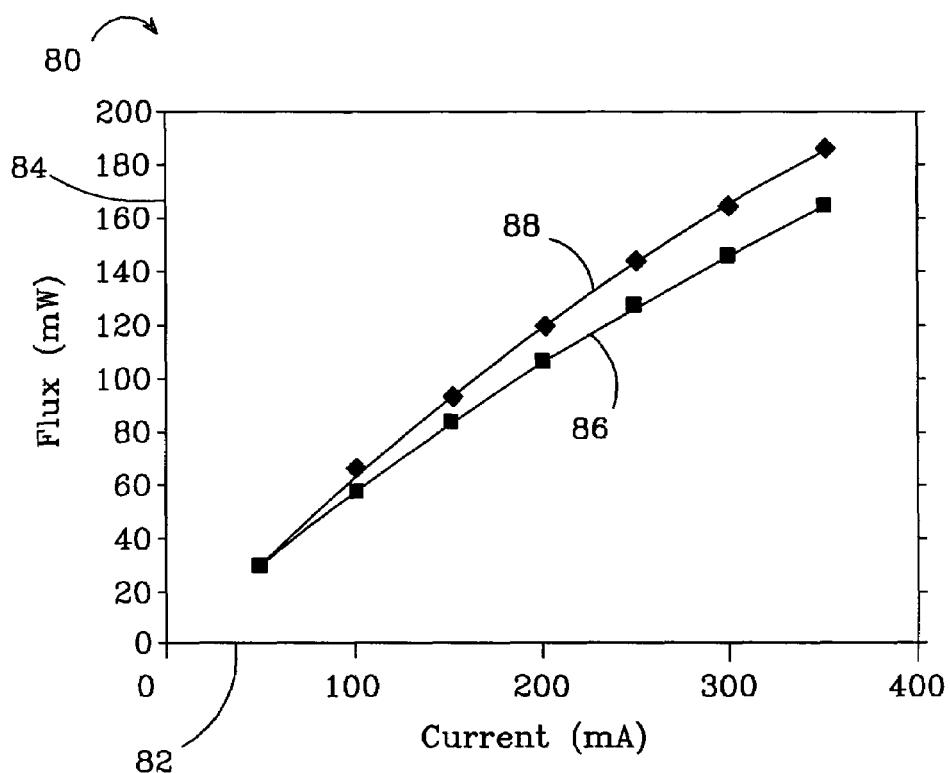
FIG. 4 is a table illustrating the improved light extraction for an LED according to the invention compared to a conventional LED.

FIG. 4 is a table 80 comparing the performance of a standard LED package and the performance of an LED package with a porous layer according to the present invention. The table 80 plots the current 82 applied to the LEDs verses the light output flux 84 of the LEDs. The first plot 86 is for the standard LED and shows that as the current 82 increases the light output flux 84 increases. The second plot 88 is for the LED with a porous layer according to the present invention which also shows that as the current 82 increases, the output flux 84 also increases. However, the output flux for the porous layer LED at the same current as a standard LED is generally greater, particularly as the current applied to the LEDs increases past approximately 50 mA.

Figure 5:
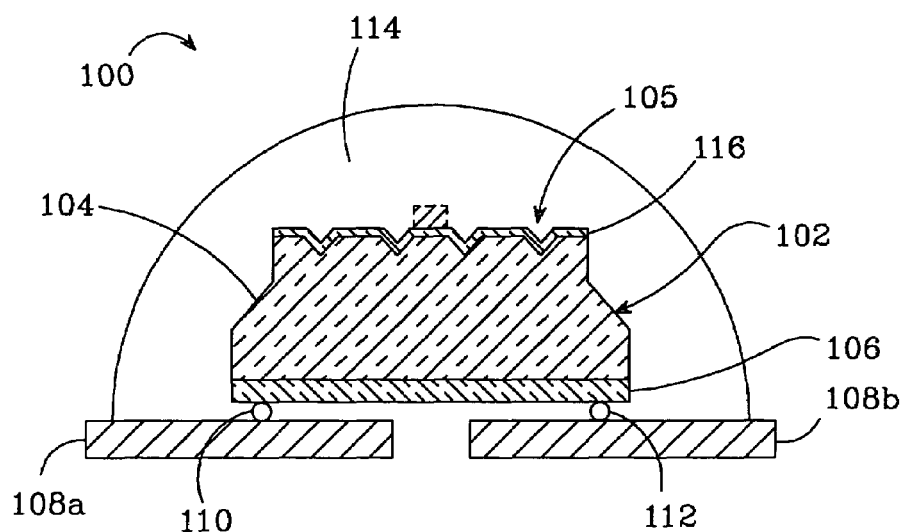
FIG. 5 is a sectional view of another embodiment of an LED according to the present invention having a substrate with a sawtooth pattern.

Many different types of LEDs can utilize a porous layer according to the present invention to increase light extraction. FIG. 5 shows another embodiment of an LED package 100 according to the present invention that includes LED 102 that comprises a substrate 104 with a semiconductor emission region 106 formed on one of its surfaces. The emission region 106 is similar to emission region 56 in FIG. 3. The LED 102 is mounted on first and second metal layers 108a, 108b having contacts 110, 112 to contact the oppositely doped layers in the emission region 106. A bias applied to the metal layers 108a, 108b can be applied to the oppositely doped layers through the contacts 110, 112. The LED 102 is flip-chip mounted in such that the substrate's bottom surface is the primary emitting surface of the LED 102. The LED 102 can also be encased in a protective transparent epoxy 114.

The emitting surface of the LED 102 (surface of substrate 104) is not flat, but instead has a sawtooth pattern 105. The sawtooth pattern 105 is formed on the substrate 104 using known processes such as etching, and a porous layer 116 is formed in the sawtooth pattern 105. The porous layer can be formed using the apparatus 10 and method 30 described above and shown in FIGS. 1 and 2. The sawtooth pattern 105 enhances light extraction by providing a varying surface to allow TIR light to escape from the LED. The porous layer 116 in combination with the sawtooth pattern 105 can provide even a greater degree of light extraction compared to a flat substrate surface with the porous layer.

Figure 6:
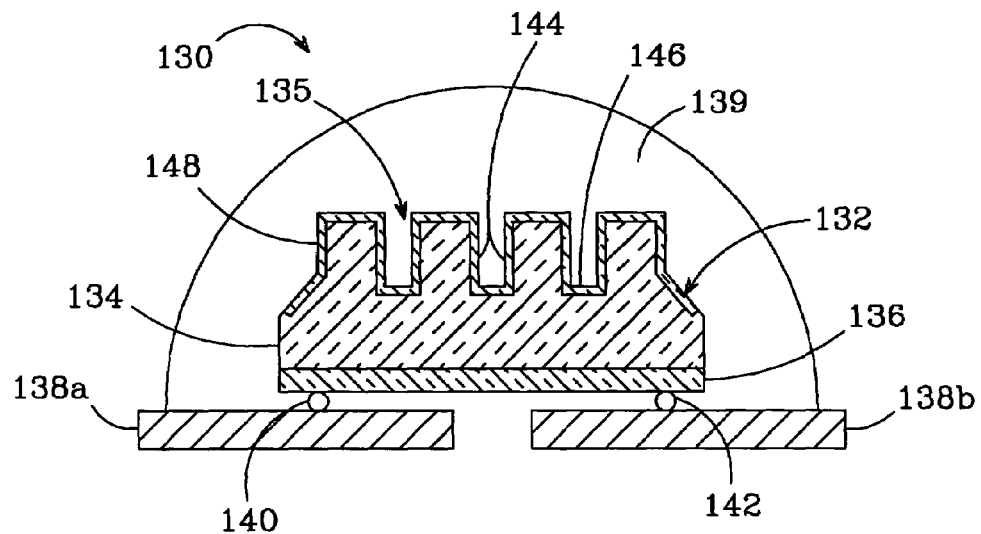
FIG. 6 is a sectional view of another embodiment of an LED according to the present invention having a substrate with a trench pattern.

FIG. 6 shows another embodiment of a LED package 130 according to the present invention also having a flip- chip mounted LED 132 comprising a substrate 134 and an emission region 136. The LED 132 is mounted to metal layers 138a, 138b with contacts 140, 142 to apply a bias to the emission region 136. The LED 132 is also encased in a protective transparent epoxy 139. The emitting surface of the substrate 134 has a trench pattern 135 with each of the trenches having vertical sidewalls 144 and a horizontal bottom surface 146. After formation of the trench pattern 135 on the substrate 134 a porous layer 148 is formed on the trench pattern. The trench pattern 135 and porous layer 148 combination provides enhanced light extraction from the LED 132.

Figure 7:
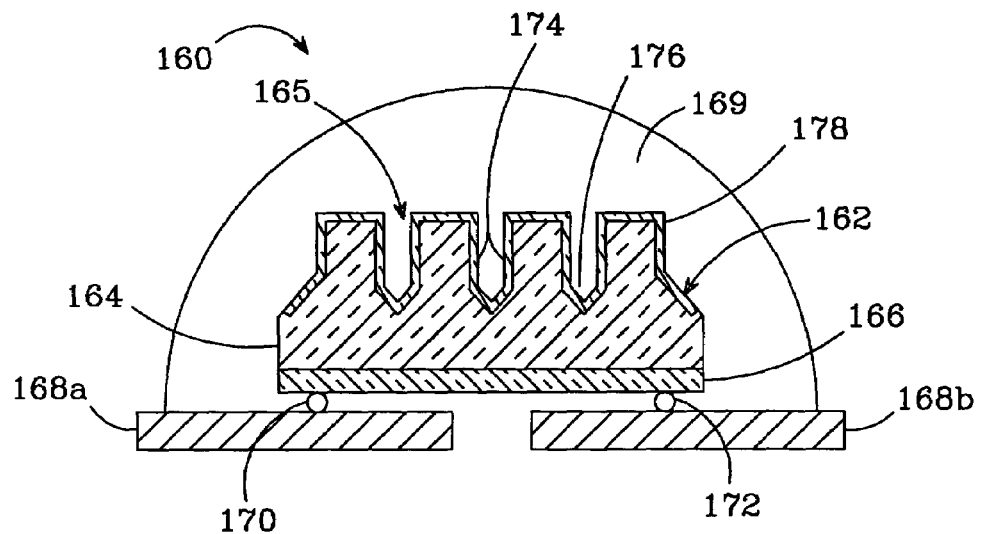
FIG. 7 is a sectional view of still another embodiment of an LED according to the present invention having a substrate with a post pattern.

FIG. 7 shows still another embodiment of an LED package 160 according to the present invention also having a flip-chip mounted LED 162 comprising a substrate 164 and an emission region 166. The LED 162 is mounted to metal layers 168a, 168b with two contacts 170, 172 to apply a bias to the emission region 166. The LED 162 is also encased in a protective transparent epoxy 169. The emitting surface of the substrate 164 has a post pattern 165 that is similar to the trench pattern 135 in FIG. 6. Each post has vertical sidewalls 174 but the bottom surface 176 between posts is V-shaped. After formation of the post pattern 165 on the substrate 164 a porous layer 178 is formed and the post pattern 165 and porous layer 178 combination provides enhanced light extraction from the LED 162.

Although the present invention has been described in considerable detail with reference to certain preferred configurations thereof, other versions are possible. Each of the embodiments LED packages described above can have different components, such as a metal cup instead of a metal layer. Different embodiments of LED packages according to the present invention can have a porous layer in different locations in its LED. The substrate can also have many different patterns beyond those described above. Therefore, the spirit and scope of the invention should not be limited to the preferred versions of the invention described above.

What is claimed is:

1. A light emitter, comprising:
a substrate having a porous layer; and
a semiconductor emission region formed on said substrate, said emission region capable of emitting light omnidirectionally in response to a bias, said porous layer on one or more surfaces of said substrate not covered by said emission region, said porous layer enhancing extraction of said emission region light passing through said substrate.

2. A light emitter, comprising:
a substrate having a porous layer; and
a semiconductor emission region formed on said substrate, said emission region capable of emitting light omnidirectionally in response to a bias, said porous layer enhancing extraction of said emission region light passing through said substrate wherein said porous layer is on the surface of said substrate opposite said emission region.

3. The emitter of claim 2, wherein said emission region comprises an active layer sandwiched between two oppositely doped layers, said active layer emitting light omnidirectionally when a bias is applied across said oppositely doped layers.

4. The emitter of claim 2, wherein said substrate and its emission region are mounted in a flip-chip orientation with said surface of said substrate having said porous layer as the primary emitting surface of said emitter.

5. The emitter of claim 4, wherein said substrate and its emission region are mounted on metal layers, said bias applied to said emitting region through said metal layers.

6. The emitter of claim 2, wherein said substrate and its light emission region are encased in a protective epoxy.

7. The emitter of claim 2, wherein said substrate is made of silicon carbide (SiC).

8. A light emitter, comprising:
   a substrate having a porous layer; and
   a semiconductor emission region formed on said substrate, said emission region capable of emitting light omnidirectionally in response to a bias, said porous layer enhancing extraction of said emission region light passing through said substrate wherein said emission region is formed on a surface of said substrate, the surface of said substrate opposite said emission region being patterned, said porous layer on said patterned surface of said substrate.

9. The emitter of claim 8, wherein the surface of said substrate opposite said emission region has a sawtooth pattern, said porous layer formed on said sawtooth patterned surface of said substrate.

10. The emitter of claim 8, wherein the surface of said substrate opposite said emission region has a trench pattern, said porous layer formed on said surface of said trench patterned surface of said substrate.

11. The emitter of claim 8, wherein the surface of said substrate opposite said emission region has a post pattern, said porous layer on said post patterned surface of said substrate.

12. A light emitting diode (LED) package, comprising:
    an LED comprising;
       a substrate with a porous layer on one surface;
       an emission region formed on said substrate on a surface opposite said porous layer;
    one or more metal layers, said LED flip-chip mounted to said metal layers with said substrate being the primary emission surface of said LED; and
    two contacts for applying a bias across said emission region causing said emission region to emit light omnidirectionally, said porous layer enhancing light extraction of emission region light passing through said substrate.

13. The LED package of claim 12, wherein said emission region comprises an active layer sandwiched between two oppositely doped layers, said bias applied across said oppositely doped layers causing said active layer to emit light omnidirectionally.

14. The LED package of claim 12, wherein said LED is encased in a protective epoxy.

* * * * *

UNITED STATES PATENT AND TRADEMARK OFFICE
CERTIFICATE OF CORRECTION

PATENT NO. : 6,972,438 B2 Page 1 of 1
DATED : December 6, 2005
INVENTOR(S) : Ting Li, James Ibbetson and Bernd Keller It is certified that error appears in the above-identified patent and that said Letters Patent is hereby corrected as shown below:

<u>Column 1,</u>
Line 54, insert -- . -- after "ambient".

<u>Column 4,</u>
Line 65, change "100 MA/cm$^2$" to read -- 100 mA/cm$^2$ --.

Signed and Sealed this

Eighteenth Day of April, 2006

JON W. DUDAS
*Director of the United States Patent and Trademark Office*